United States Patent
Markle et al.

(10) Patent No.: US 11,356,120 B1
(45) Date of Patent: Jun. 7, 2022

(54) HIERARCHICAL ERASURE CODING FOR MULTI-REGION STORAGE

(71) Applicant: Amazon Technologies, Inc., Seattle, WA (US)

(72) Inventors: Seth W. Markle, Seattle, WA (US); Andrew Kent Warfield, Vancouver (CA); Qianyong Yu, Burnaby (CA); Grant Fresen, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 17/021,696

(22) Filed: Sep. 15, 2020

(51) Int. Cl.
*H03M 13/15* (2006.01)
*G06F 11/10* (2006.01)

(52) U.S. Cl.
CPC ....... *H03M 13/154* (2013.01); *G06F 11/1076* (2013.01)

(58) Field of Classification Search
CPC .................. H03M 13/154; G06F 11/1076
See application file for complete search history.

(56) References Cited

U.S. PATENT DOCUMENTS

| | | | | |
|---|---|---|---|---|
| 8,504,535 B1 * | 8/2013 | He | ...................... | G06F 16/9574 707/695 |
| 8,935,221 B1 * | 1/2015 | Lazier | ..................... | G06F 16/24 707/690 |
| 9,251,097 B1 * | 2/2016 | Kumar | .................. | G06F 21/602 |
| 9,672,110 B1 * | 6/2017 | Patel | .................... | G06F 11/1076 |
| 9,838,041 B1 * | 12/2017 | Lazier | .................. | G06F 21/6218 |
| 9,898,474 B1 * | 2/2018 | Sorenson, III | .......... | G06F 3/061 |
| 10,073,730 B1 * | 9/2018 | Donlan | ................. | H03M 13/00 |
| 10,270,475 B1 * | 4/2019 | Lazier | .................. | G06F 11/1076 |
| 10,296,633 B1 * | 5/2019 | Collins | ................. | G06F 16/215 |
| 10,432,721 B2 * | 10/2019 | Vermeulen | ............ | G06F 16/184 |
| 2015/0169253 A1 * | 6/2015 | Donlan | ................. | G06F 3/0647 711/161 |
| 2015/0169716 A1 * | 6/2015 | Franklin | ................. | G06F 16/27 707/610 |
| 2016/0044108 A1 * | 2/2016 | Vermeulen | ............ | G06F 16/184 709/218 |
| 2016/0154963 A1 * | 6/2016 | Kumar | .................. | G06F 21/602 713/189 |
| 2018/0165015 A1 * | 6/2018 | Malina | ................. | H03M 13/154 |
| 2018/0165016 A1 * | 6/2018 | Malina | .................. | G06F 3/0611 |
| 2018/0189148 A1 * | 7/2018 | Adams | .................. | G06F 16/122 |
| 2018/0285219 A1 * | 10/2018 | Donlan | ................. | G06F 11/1662 |
| 2018/0287801 A1 * | 10/2018 | Donlan | ................... | G06F 21/78 |
| 2018/0288049 A1 * | 10/2018 | Donlan | ............... | H04L 67/1097 |

* cited by examiner

*Primary Examiner* — Kyle Vallecillo
(74) *Attorney, Agent, or Firm* — Davis Wright Tremaine LLP

(57) ABSTRACT

Described are systems and methods for storing a data object using a hierarchical erasure encoding to store a physical representation of the data object across a plurality of fault domains. A first erasure encoding is applied to the data object to generate a first set of shards of the data object. Individual shards of the set of shards may then be distributed across the fault domains for storage. Within the fault domains a second erasure encoding may be applied to the individual shards to generate a second set of shards. Finally, a manifest may be generate in order to reconstruct the data object from the first set of shards and the second set of shards.

20 Claims, 8 Drawing Sheets

Manifest

```
{
    "encoding":"ReedSolomon",
    "encoding_parameters":"2,3",
    "size":"14680064",
    "shards":[
        {
            "loc":"xyz:region1/5592f8b",
            "size":7340032,
        },
        {
            "encoding":"Replica",
            "encoding_parameters": "2",
            "shards":[
                {
                    "loc":"abc:region2/592f87ced4cf6f31d0b",
                    "size":7340032,
                },
                {
                    "loc":"pfq:region3/592f87ced4cf6f31d0b",
                    "size":7340032,
                }
            ]
        },
        {
            "encoding":"Replica",
            "encryption key": "11111111",
            "compression":"lots"
            "shards":[
                {
                    "loc":"rfq:staging/592f87ced4cf6f31d0b",
                    "expiration":"08:24:23;05/16/2021",
                    "size":7340032,
                },
                {
                    "loc":"atb:regionn/592f87ced4cf6f31d0b",
                    "etag":"zzz",
                    "size":7340032,

United States Patent US 11,356,120 B1

HIERARCHICAL ERASURE CODING FOR MULTI-REGION STORAGE

BACKGROUND

The proliferation of network computing and storage, as well as the attendant increase in the number of entities dependent on network computing and storage, has increased the importance of optimizing data performance and integrity on network computing and storage systems. Data storage systems and services, for example, may use various types of error correcting and error tolerance schemes, such as the implementation of erasure coding and data sharding. In implementations using such data sharding methods, integrity checks and other types of data verification, as conducted using previously known techniques, may be resource-heavy, computationally inefficient, or otherwise onerous to complete.

BRIEF DESCRIPTION OF THE DRAWINGS

Various techniques will be described with reference to the drawings, in which:

FIG. 2 illustrates a manifest associated with the data object stored across regions in accordance with various embodiments;

DETAILED DESCRIPTION

Figure 1:
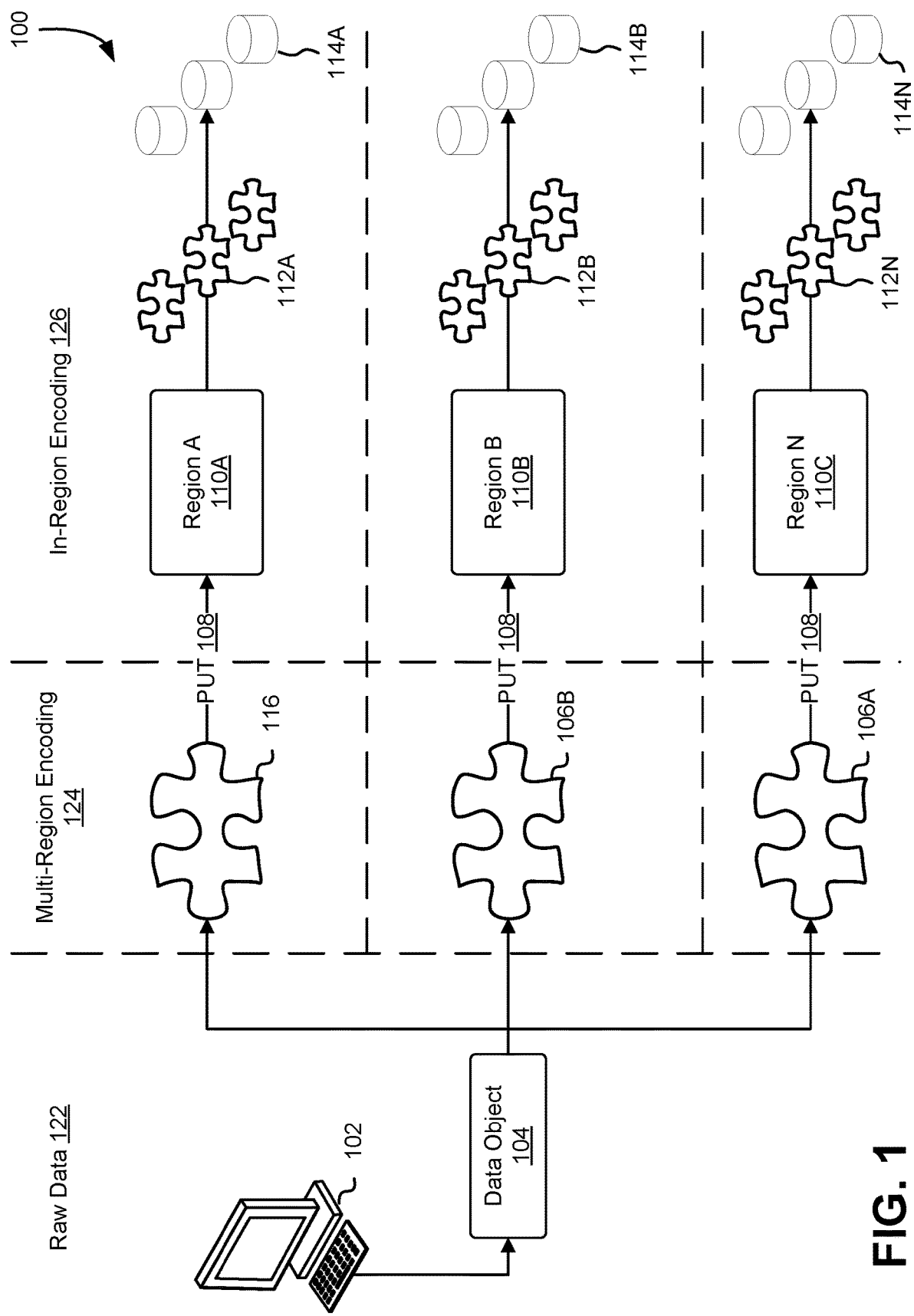
FIG. 1 illustrates an environment in which hierarchical erasure coding is used to store a data object across regions in accordance with various embodiments.

Techniques described and suggested in the present disclosure include various methods and systems for ensuring data redundancy, while minimizing resource utilization associated with maintaining data redundantly, by using a hierarchical erasure coding scheme. In various embodiments, hierarchical erasure codes (e.g., multi-level codes) are used to provide region-failure tolerance for customer data. For example, a first level encoding ensures regional fault tolerance by producing k shards (e.g., 1 shard per region) where only k−1 shards are required to reconstruct the data object. These shards, for example, can be distributed to various data centers across participating regions.

Within the participating regions a second level of encoding may be applied to a particular shard to achieve multi-level codes. For example, when a participating region obtains a shard of the data object for storage, a computer system within the participating region applies erasure encoding to the shard to generate a set of shards and distributes the set of shards among data storage devices within the region. In various embodiments, a particular region may recreate a shard associated with that region using data within that region. In addition, the data object (e.g., a representation of the original data object provided for storage) may be reconstructed by at least obtaining a shard from a requisite number of regions (e.g., k−1 shards from one or more regions).

Furthermore, the hierarchical erasure coding techniques described in the present disclosure may be applied to N levels. For example, in addition to the regional level described in the example above, the hierarchical erasure codes may be applied to a third level such as data centers within a region. In this manner, the hierarchical erasure coding techniques may be flexibly applied to a variety of environments and systems. In order to reconstruct the data object, in various embodiments, a manifest is generated and includes information to reconstruct the data object from k−1 shards. In general, the manifest may include instructions or other information indicating a set of transformation of the set of shards that, as a result of being performed, cause the data object to be reconstructed. In one example, the manifest includes information indicating an encoding used (e.g., Reed-Solomon codes) and a set of locations (e.g., regions) corresponding to shards of the set of shards. For example, the manifest may include location information indicating storage locations for shards of the set of shards. The manifest may also include information indicating other transformations applied to the data object. For example, the manifest may indicate an encryption algorithm, an encryption key, a compression algorithm, or other transformation applied to the data. In various embodiments, the manifest is stored redundantly across regions allowing the data object to be obtained from any region where a manifest is stored.

In the preceding and following description, various techniques are described. For purposes of explanation, specific configurations and details are set forth in order to provide a thorough understanding of possible ways of implementing the techniques. However, it will also be apparent that the techniques described below may be practiced in different configurations without the specific details. Furthermore, well-known features may be omitted or simplified to avoid obscuring the techniques being described.

FIG. 1 illustrates an environment 100 in which hierarchical erasure coding is used to store a data object 104 across regions (e.g., region A 110A, region B 110B, and region N 110C) in accordance with various embodiments. In an embodiment, a computing entity 102 may cause the data object 104 to be stored within a data storage service of a computing resource service provider. The data storage service may utilize hierarchical erasure coding techniques described in the present disclosure to redundantly store the data object 104. As described in greater detail below, the hierarchical erasure coding techniques may include a plurality of levels. For example, raw data 122 may include the data object 104, a stream of data, or other forms of data. At the multi-region encoding 124 level, a first coding algorithm may be applied to the raw data 122. Then at the in-region encoding 126 level, a second coding algorithm may be applied to shards of data generated at the multi-region encoding 124 level.

In general, redundancy encoding techniques, which may also be referred to as erasure encoding techniques, may be applied to raw data 122 to increase, for example, availability, redundancy, and durability while minimizing the number of extra storage volume required. Examples of such techniques include Reed-Solomon, Cauchy Reed-Solomon, fountain codes, regenerating codes, Raptor codes, MDS codes, and LT codes.

For example, in erasure encoding techniques, the stretch factor is a measure of the number of storage volumes required to store a volume's worth of data. Erasure encodings with relatively high stretch factors typically provide high degrees of resiliency to data loss, at the expense of being less space-efficient. Erasure encodings with relatively low stretch factors, on the other hand, are less resilient but are more space efficient. Note that in some circumstances, properties such as resiliency to data loss or performance may be adjusted without alterations to the stretch factor. For example, doubling the number of identity and parity shards would not change the stretch factor, since the ratio between identity and parity shards would remain constant, but would increase the resiliency of the encoded data to data loss. The techniques described herein, except where explicitly noted, are applicable both to hierarchical erasure codings that affect the stretch factor, as well as to hierarchical erasure codings that do not affect the stretch factor.

The raw data 122, including datasets, data archives, data objects, or other data, in various embodiments, is received from clients (e.g., computing entity 102) of the computing resource service provider for storage using the storage service. In one example, the data object 104 is received from other services provided by the computing resource service provider including, but not limited to, compute services, block-level data storage services, virtual machine services, or other such services.

Using an erasure encoding technique, data objects stored by the storage service may be grouped into a collection of shards (e.g., parity shard 116, identity shards 106A and 106B) where each shard represents a logical distribution of the data objects. A shard, as used herein, is a logical representation of the data object 104. Furthermore, although the shards in FIG. 1 may be referred to as parity shard 116 or identity shards 106A and 106B, other types of shards are contemplated and may be dictated by the encoding scheme used. In other words, depending on the encoding scheme used to encode the data object 104 different types of shards may be generated. In particular, as used herein, a shard refers to a portion of an encoding of the data object 104. For example, in an embodiment, an encoding, or simply a coding, is applied to the data object 104 to produce a set of shards which logically represents the data object 104. In an embodiment, an erasure encoding or redundancy encoding is applied to the data object 104, producing a set of identity shards 106A and 106B and a set of parity shards 116 or simply a set of shards.

The identity shard 106A or 106B is representative of a portion of the original data (e.g., the data object 104). For example, in an embodiment, if the data object 104 is divided into k identity shards, the identity shard 106A or 106B is a copy of a portion of the original data object 104. The dataset may be reconstructed based on a recombination of the k identity shards.

The parity shard 116 is an encoded representation of a portion of the original data (e.g., the data object 104). For example, in an embodiment, the parity shard 116 is generated via bitwise arithmetic on one or more of the identity shards 106A and/or 106B. In the event of a failure, the data object 104 may be reconstructed using the remaining parity shards 116 and/or identity shards 106A and/or 106B. The original data can be reconstructed if at least k−1 shards remain, in any combination of identity shards 106A and/or 106B and/or parity shards 116.

Identity shards 106A and 106B are one example of what may be referred to as a quorum shard. As used herein, the term quorum shard refers to a member of a group of shards that, collectively, may be used to reconstruct the data object 104. In the case of Reed-Solomon encoding, for example, the set of c may be referred to as the set of quorum shards. In another example, a set of quorum shards may comprise k−1 of the encodings shards, where k−1 in this example is the minimum number of shards predicted to be usable to reconstruct the data object 104.

In an embodiment, these shards (e.g., 106A and 106B and parity shards 116) are stored on an associated data storage device and/or an associated data storage volume such as a staging data store described in greater detail below in connection with FIGS. 3 and 4. Furthermore at this stage, these shards (e.g., 106A and 106B and parity shards 116) may be considered a multi-region encoding 124, these shards may then be distributed to various regions for in-region encoding 126 and storage. As illustrated in FIG. 1, the parity shard 116 is distributed to region A 110A via a PUT request 108, region A 110A then applies a second erasure encoding to the parity shard 116 generating a second set of shards 112A-112N. The second set of shards 112A-112N, may include any combination of shards described above (e.g., identity and parity shards) and may be encoded using any of the techniques described in the present disclosure. In various embodiments, the second set of shards 112A-112N are distributed to regional storage devices 114A-114N. The regional storage devices 114A-114N may include storage devices as described in the present disclosure within a particular region. For example, the regional storage devices 114A-114N includes a set of disk drives distributed among a plurality of data centers within region A 110A.

Furthermore, in various embodiments, the PUT request 108 include an application programming interface (API) call to a server within a particular region (e.g., region A 110A). The PUT request 108 may include a shard of the data object (e.g., identity shard 106A) and other additional data. For example, the PUT request 108 may include an indicating of a storage class or type of storage object (e.g., a shard of the data object 104) included in the PUT request 108. In various embodiments, the additional data provides the region with information regarding handling of the shard included in the PUT request 108. If the region, for example, stores data redundantly (e.g., as a default storage operation), the additional information (e.g., storage class) allows the region to generate fewer shards of the second set of shards 112A-112N. Due to the nature of the hierarchical erasure encoding, the number of shards at a particular level may be reduced without sacrificing redundancy of the original data (e.g., the data object 104). Furthermore, in some embodiments, the storage class for a particular data object may indicate a minimum level of data redundancy which may be met or exceeded using fewer shards at each level of the hierarchical encoding described in the present disclosure.

The computing entity 102 may include a customer of the computing resource service provider and, in some embodiments, a customer of the data storage service provided by the computing resource service provider. The computing entity 102 may be any entity capable of providing data to another entity, such as over a network, and by way of example may include physical computing devices and servers, laptops, smartphones, virtual computing systems (such as may be provided by one or more resources of the computing resource service provider), computing services, and the like. The data object 104 may be any data, such as data controlled by a customer, and the data may be unencrypted or encrypted. In some embodiments, the data object 104 provided by the computing entity 102 is encrypted (e.g., a customer or by request of the customer) and a component associated with the computing resource service provider may decrypt the data.

It is contemplated that various other data transformations, such as compression, encryption, and decryption, may be implemented in connection with any of the techniques described herein. For example, a customer may provide the data object 104, and a resource of the computing resource service provider generate an encrypted data object prior to applying a redundancy coding scheme upon the encrypted data object. As another example, the shards may be individually or collectively encrypted, and various decryption and encryption processes may be incorporated during various verification and integrity information generation/comparison processes as necessary, e.g., so as to ensure end-to-end security of the original data element and the associated data shards.

The shards (e.g., identity shard 106A) described in connection with FIG. 1 are, in some embodiments, erasure coded data shards, a quantity of which may be sufficient to reconstruct the data object 104 at the multi-region encoding 124 stage and individual shards at the in-region encoding 126 stage. The quantity of shards created at each level of encoding (e.g., multi-region encoding 124 or in-region encoding 126) may be selected based on a number of factors, including the contents of shards, the applied erasure coding algorithm, present or historical computational, storage, or network load on resources hosting shards including regional resources, regulatory compliance, present or historical failure rate associated with resources, present or historical response time of various resources, level of data redundancy to be provided, number of fault domains, number of available regions, number of network links between regions, and other factors. In some embodiments, the quantity may be equal to the minimum number of shards necessary to reconstruct the data object 104 (e.g., as a result of the erasure coding applied) if a region is unavailable, while in other embodiments, the quantity may be greater than that minimum number. In general, hierarchical erasure encoding may reduce the net cost of storing the data object 104 by increasing the durability to a regional level.

In various embodiments, reconstructed versions of the data object 104 may be stored, temporarily held, or transiently generated, e.g., by a virtual computing system or other resource associated with the computing resource service provider. For example, as described in greater detail below, in response to a GET request from the computing entity 102. Although not illustrated in FIG. 1 for simplicity, in various embodiments, at the multi-region encoding 124 level a manifest is generated prior to distribution of the shards.

FIG. 2 illustrates a manifest 200 used in connection with a hierarchical erasure encoded data object in accordance with various embodiments. The manifest 200 may be metadata, a file, a spate data object, or any other form of data maintained by a system or service for the purpose of storing or retrieving data object stored using the hierarchical erasure encoding methods and techniques described in the present disclosure. In one example, the manifest 200 is created in response to a PUT request to store a data object as described above.

In various embodiments, the manifest 200 maps a logical presentation of the data object to a physical representation of the data object (e.g., a representation of the bytes stored on the physical hardware). Furthermore, as a result of the hierarchical erasure encoding the manifest 200, in various embodiments, points to one or more intermediate logical representations of particular shards of the data object. For example, at the multi-region encoding level the manifest 200 indicates a set of regions that may contain shards of the data object, the subset of regions of the set of regions that maintain at least one shard further include an additional manifest which points to the location of the stored data within the particular region. In this manner, the manifest 200 may also be considered hierarchical in so much as the manifest 200 points to additional manifests that contain in-region storage location information. The location information may include any information suitable for obtaining a shard or set of shards. For example, the location information may include network address, MAC address, alias, identifier, namespace, subnet, storage information, or combination thereof suitable for determining physical location of a shard or set of shards.

In addition to containing a representative mapping of the logical representation of the data object to the physical data stored in various regions, in some embodiments, the manifest 200 also contains information indicating the physical representation of the data prior to destaging. For example, at the multi-region encoding level and described in greater detail below in connection with FIGS. 3 and 4, the data object is staged prior to distribution of the shards to the various region. The process of destaging the shards (e.g., distribution to the various regions) may take some interval of time (e.g., 18-36 hours); therefore, the manifest 200 may include a representation of the data object during this interval of time. This additional information may allow a computer system retrieving the data object to determine whether to obtain the data object locally or remotely. For example, if a GET request is obtained during the interval of time, the computer system processing the GET request attempted to obtain the shards of the data object locally before transmitting a request to various remote regions to obtain the shards.

In various embodiments, the manifest 200, in addition to containing information indicating the location of shards of the data object and the physical information stored by various systems, includes information and/or instructions for reconstructing the data object. For example, the manifest 200 includes information describing the set of instructions to reconstruct that data object. In yet another example, the manifest includes the set of instructions (e.g., executable code) that, as a result of being executed by a computer system, causes the computer system to reconstruct the data object from a set of shards. In other words, the manifest 200 may include information used to generate instructions and/or operations to reconstruct the data object or may simply include the instructions to be executed to reconstruct the data object. In various embodiments, the manifest 200 includes, at a minimum, information to reconstruct the data object. In one example, the erasure encoding algorithm used to generate the shards is included in the manifest 200. Furthermore, the manifest 200 may include the size of the data object, the number of shards encoded, the size of each shard, the number of shards required to reconstruct the data object, the number of regions the shards are distributed to, and any other information suitable for reconstructing the data object.

In yet other embodiments, the manifest 200 is created such that the logical representation of the data object (e.g., number of shards) provides a particular level of durability while expressing an end state (e.g., the possible regions and/or physical location of the data representing the shards and/or data object) that provides flexibility to move particular shards between regions and/or fault domains. For example, if capacity within a region is approaching a limit, shards may be moved between regions indicated in the manifest 200. The manifest 200 may include a number of possible locations for a set of shards, where the number of possible locations is greater than a number of members of the set of shards. For example, the manifest 200 indicates that Reed-Solomon encoding with 6 shards (e.g., 5 identity shards and 1 parity shard) is applied to the data object and the shards may be stored in any of the 8 possible regions indicated in the manifest 200. In this manner, the manifest 200 may indicate all possible end states for that data object (e.g., possible physical storage locations within regions for the shards of the data object), this allows for flexibility to move data between regions to account for capacity constraints without the need to modify the manifest 200 if data is moved.

As described above, in various embodiments, the data object may have additional transformation applied. For example, compression or encryption can be used either before the hierarchical erasure encoding is applied to the data object or to the shards of the data object once a particular level of the hierarchical erasure encoding is applied to the data object or shards of the data object. In such embodiments, the manifest 200 may include additional information and/or instructions to reverse such transformation or otherwise reconstruct the data object. In addition, the manifest 200 may be distributed to the regions along with shards of the data object. In other embodiments, the manifest 200 is maintained in one or more regions separate from the shards of the data object. For example, if particular regions and/or computer systems are designated for retrieval of the data object, the manifest 200 may be maintained in these regions of computer systems as the manifest 200 is required to reconstruct the data object. In various embodiments, the manifest 200 includes information indicating all possible physical representations of the data object (e.g., all possible storage locations, encodings, transformations, shards, etc.) thereby eliminating the need to edit or otherwise modify the manifest 200 after creation. In yet other embodiments, the manifest 200 is generated or otherwise edited once the data object is maintained in a physical representation. For example, once the shards are distributed and stored within regions, the manifest 200 is modified to record the storage locations of the shards.

Figure 3:
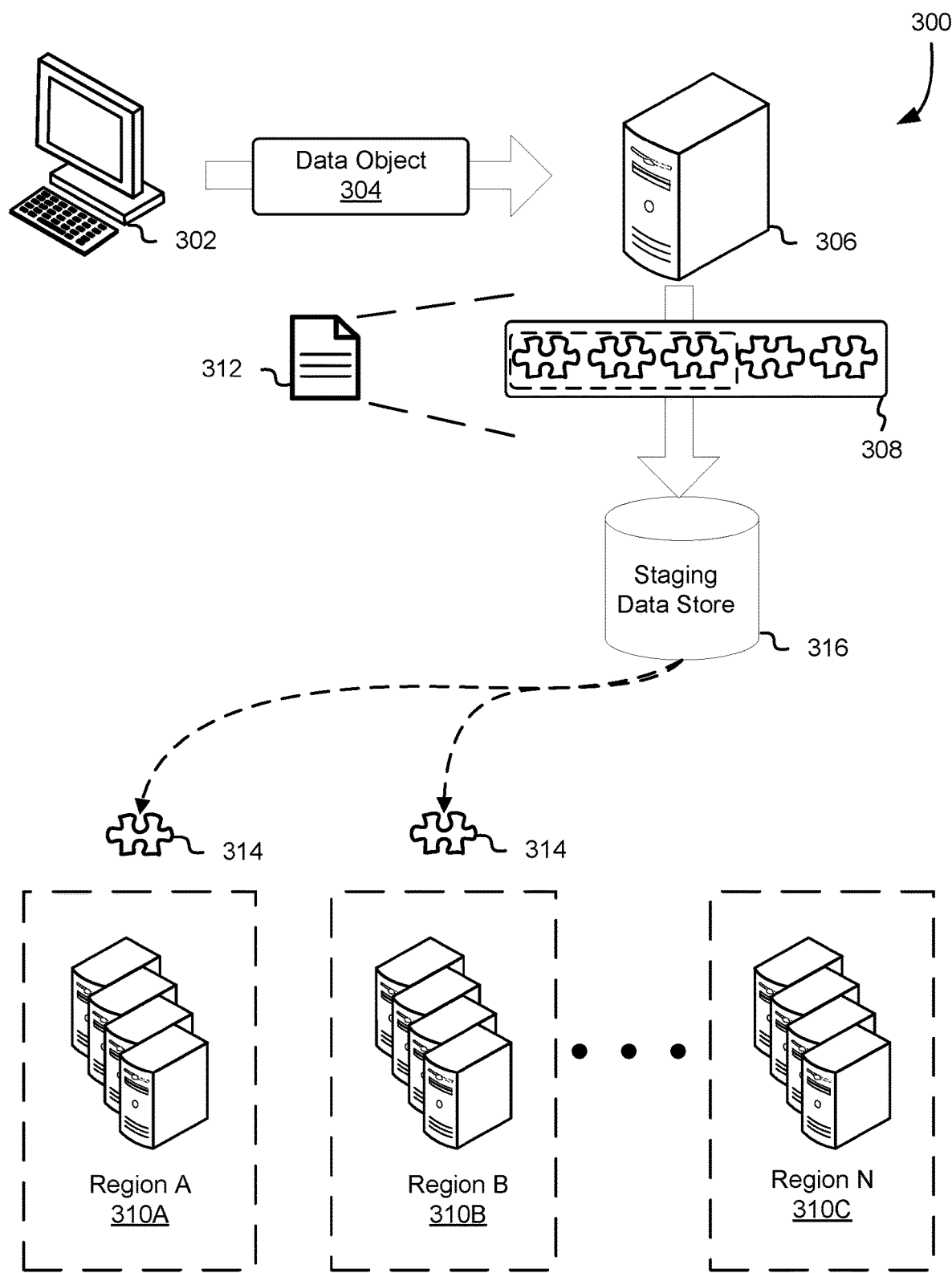
FIG. 3 illustrates an environment in which a data object is stored across regions using hierarchical erasure coding in accordance with various embodiments.

FIG. 3 illustrates an environment 300 in which a computing resource service provider 306 or service thereof stores a data object 304 using hierarchical erasure encoding in accordance with various embodiments. In response to a request from a computing entity 302 to store the data object 304, the computing resource service provider 306, in various embodiments, applies a hierarchical erasure encoding to the data object 304 to generate a set of shards 308 and generates manifest 312. The set of shards 308 may be maintained in a staging data store 316 for an interval of time until destaged by at least distributing individual shards 314 of the set of shards 308 to various regions (e.g., region A 310A, region B 310B, or region N 310C). The computing entity 302 may be any computing resources as described above in connection with FIG. 1. In addition, the manifest 312 may include data or other information as described above in connection with FIG. 2. Furthermore, the set of shards 308 may include any shards or other data generated by applying erasure encoding to a data object 304 as described above in connection with FIG. 1.

The computing resource service provider 306 may provide a variety of services to a customer (e.g., a customer operating the computing entity 302) and the customer may communicate with the computing resource service provider 306 via an interface, which may be a web services interface or any other type of customer interface. Various services of the computing resource service provider 306 may have separate interfaces and, generally, subsets of the services may have corresponding interfaces in addition to or as an alternative to the computing resource service provider 306. The customer may be an organization or entity that utilizes one or more of the services provided by the computing resource service provider 306 to perform various operations described in the present disclosure such as storing and retrieving data. In various embodiments, the computing entity 302 communicates with the computing resource service provider 306 over a network, whereby the network may be a communication network, such as the Internet, an intranet, or an Internet service provider (ISP) network. Some communications from the computing entity 302 to the computing resource service provider 306 may cause the computing resource service provider 306 to operate in accordance with one or more embodiments described or a variation thereof.

The computing resource service provider 306 may provide various computing resource services to customers and/or the computing entity 302. The services provided by the computing resource service provider 306, in one example, include a virtual computer system service, a block-level data storage service, a cryptography service, an on-demand data storage service, a notification service, an authentication service, a policy management service, and a task service. It is noted that not all embodiments described include these services and additional services may be provided in addition to or as an alternative to services explicitly described. In addition, each of the services may include one or more service interfaces that enable the services to access each other (e.g., to enable a virtual computer system of the virtual computer system service to store data in or retrieve data from the data storage service described in the present disclosure). In addition, the regions (e.g., region A 310A, region B 310B, or region N 310C) used to store the shards 314, in an embodiment, are operated by the computing resource service provider 306 and include data centers and other computing resources used to implement the services described in the present disclosure.

The staging data store 316, in various embodiments, is any entity capable of receiving and storing data, and resubmitting the received data to another entity, such as the computing resource service provider 306. Examples may include physical data storage devices such as storage servers, network attached storage devices, hard disk drives, solid state disk drives, and optical drives; virtual data storage data devices such as those provided by a data storage service of a computing resource service provider, databases, and the like. The staging data store 316 may be a component or service associated with, or part of, the computing resource service provider 306. In some embodiments, the staging data store 316 may be used to temporarily hold, or "stage," data destined for another component or service associated with, or provided by, the computing resource service provider (e.g., region A 310A, region B 310B, or region N 310C). In such embodiments, the received data (e.g., the data object 304 received from the computing entity 302) may be held for a fixed and/or scheduled interval of time, until some event (e.g., as triggered by either the computing entity 302 or the computing resource service provider 306), until computing resources to destage the data are available, or indefinitely. The staging data store 316 may also include various other data manipulation facilities as necessitated by the implementation, such as encryption/decryption, compression, application of data redundancy schemes such as erasure coding, and the like.

In various embodiments, at the time of receiving data object 304 from the computing entity 302 one or more resources of the computing resource service provider 306 applies the hierarchical erasure coding scheme to the data object 304, so as to generate the set of shards 308. The erasure coding applied may be any scheme that generates data capable of representing the data object 304 in a fault tolerant, or error-resistant fashion. For example, the erasure coding applied may include various error correcting codes, such as forward error correction codes, erasure coding, and the like. While the present disclosure focuses on erasure codes and erasure coding schemes, any appropriate type of redundancy coding may be used.

Several redundancy encoding techniques may be used or, in some embodiments, more complex redundancy encoding techniques are used. In a more complex example, four data shards may be combined with two corresponding derived shards (for a total of six shards in the collection of shards) to allow the reconstruction of up to two lost shards (also referred to herein as "damaged shards") where the lost shards may be data shards, they may be derived shards, or they may be one of each. In one embodiment, the redundancy encoding scheme is a systematic erasure coding scheme, such as Reed-Solomon Coding. Reconstruction of shards in such an example may be accomplished using other redundancy codes in some embodiments such as, an online code, a Luby transform code, a Cauchy Reed-Solomon code, a regenerating code, a maximum distance separable code, a repetition code, a cyclic code, a Hamming code, a Reed-Muller code, a Goppa code, a BCH code, a Golay code, an expander code, a linear block code, a linear erasure code, and/or some other redundancy code. Furthermore, different schemes may be applied at different levels of the hierarchical erasure encoding or the same scheme with different parameters may be applied at different levels. In one example, a Reed-Solomon encoding generating 6 shards is applied at the multi-region encoding level and a Reed-Solomon encoding generating 3 shards is applied at the in-region encoding level. In general, any erasure or redundancy encoding scheme may be used at any level of the hierarchical scheme described in the present disclosure.

Returning to FIG. 3, as described above, upon receipt of the data object 304 the set of shards 308 and the manifest 312 may be created and stored in the staging data store 316 until a point in time where the set of shards are distributed to the region A 310A, region B 310B, and/or region N 310C. Any number of regions may be used in connection with the embodiments described in connection with FIG. 3 and the present disclosure. In yet other embodiments, the data object 304 is stored in the staging data store 316 until a point in time after the data object is received. For example, the data object 304 is stored in the staging data store 316 until computing resources of the computing resource service provider 306 are available to process the data object 304, these resources may include various resources in the regions (e.g., region A 310A, region B 310B, and/or region N 310C) and/or resources connecting regions, such as network communication links between regions. Although the staging data store 316 is illustrated in FIG. 3, various implementations of the hierarchical erasure encoding described in the present disclosure may not include the staging data store 316. For example, the computing resource service provider 306 encodes the set of shards 308 and transmits the shards 314 directly to the regions without staging the set of shards 308 in the staging data store 316.

In various embodiments, during destaging the computing resource service provider 306 or system thereof determines which regions are available to accept the shards 314. As illustrated in FIG. 3, regions A 310A and region B 310B are available to accept the shards 314; however, the set of shards 308 includes 3 additional shards indicated by the dashed box around. These shards may remain in the staging data store 316 until additional regions are available (availability may include storage space as well as network bandwidth to transmits data between regions. In this manner, the shards 314 may be individually moved to regions. In some embodiments, the set of shards 308 is deleted or otherwise removed from the staging data store 316 once all the shards 314 have been distributed. In yet other embodiments, the shards 314 are deleted as part of the destaging procedure (e.g., as the shards 314 are moved to a particular region).

Figure 4:
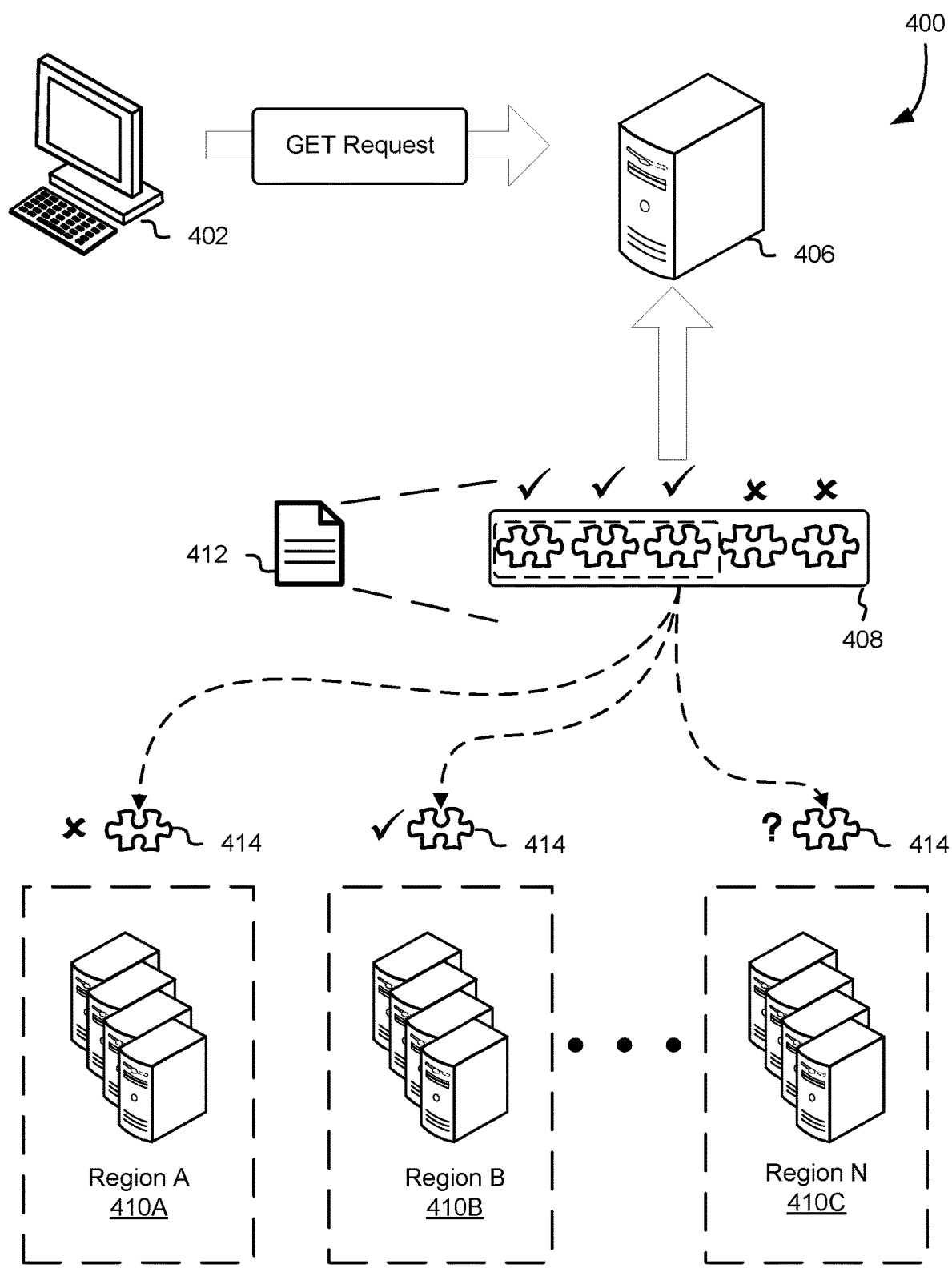
FIG. 4 illustrates an environment in which a hierarchical erasure encoded data object is obtained from storage across regions in accordance with various embodiments.

FIG. 4 illustrates an environment 400 in which a computing resource service provider 406 or service thereof retrieves a data object stored using hierarchical erasure encoding in accordance with various embodiments. The computing resource service provider 406, computer entity 402, and regions (e.g., region A 410A, region B 410B, and region N 410C) may include any of the entities described above in connection with FIG. 3. In addition, the manifest 412, set of shards 408, and shards 414 may include any of the data or other information described above in connection with FIG. 3. Returning to FIG. 4, the computing entity 402 transmits a GET request to the computing resource service provider 406. The GET request, in various embodiments, includes an API call to a computing resources within a particular region operated by the computing resource service provider 406. The particular region may include any region in which shards of the data object are stored, a region in which the request to store the data object was transmitted, or any region that maintains a copy of the manifest, any region with the computing resources needed to reconstruct the data object, or a region indicated by a customer of the computing resource service provider 406.

Upon receipt the of GET request, the computing resource service provider 406 may obtain the manifest 412. As described above, the manifest 412 includes the information necessary to reconstruct the data object. The computing resource service provider 406, in various embodiments, requests the shards 414 from regions indicated in the manifest 412 and store the shards 414 in the staging data store until sufficient shards 414 are available and the data object can be reconstructed from a subset of shards of the set of shards 408 as indicated by the dashed box in FIG. 4. In various embodiments, computing resource service provider 406 transmits requests to various regions to obtain the shards 414. The request may be transmitted in serial, parallel, or combination thereof. For example, the computing resource service provider 406 transmits requests to all the regions indicated in the manifest 412 in parallel (e.g., at the same time). In another example, the computing resource service provider 406 transmits requests in serial (e.g., transmits a single request for a particular shard and waits for a response before transmitting the next request).

As illustrated in FIG. 4, region A 410A responds to the computing resource service provider 406 indicating that the shard 414 is not stored within region A 410A shown as an "X" in FIG. 4. Region B 410B responds with the shard 414, shown as a check mark in FIG. 4, and provides the shard 414 in response to the request. In various embodiments, the shard 414 must first be reconstructed before it can be provided to the computing resource service provider 406. As described above, at the in-region encoding level, the shards 414 are encoded and a second set of shards are generated based at least in part on the shard 414. Once the shard 414 is reconstructed, it may be transmitted to the computing resource service provider 406. As described in greater detail below in connection with FIG. 7, the process of reconstructing the data object may include error handling steps to account for unresponsive regions (shown in FIG. 4 as a question mark) and regions that do not contain the requested data.

In various embodiments, once a sufficient number of shards 414 (indicated by check marks in FIG. 4, where the "X" indicates shards that were not obtained and are not needed to reconstruct the data object) are obtained and the data object is reconstructed. In addition, any additional transformation (e.g., compression or decryption) indicated in the manifest 412 may be performed by the computing resource service provider 406 prior to returning the data object in response to the GET request.

Figure 5:
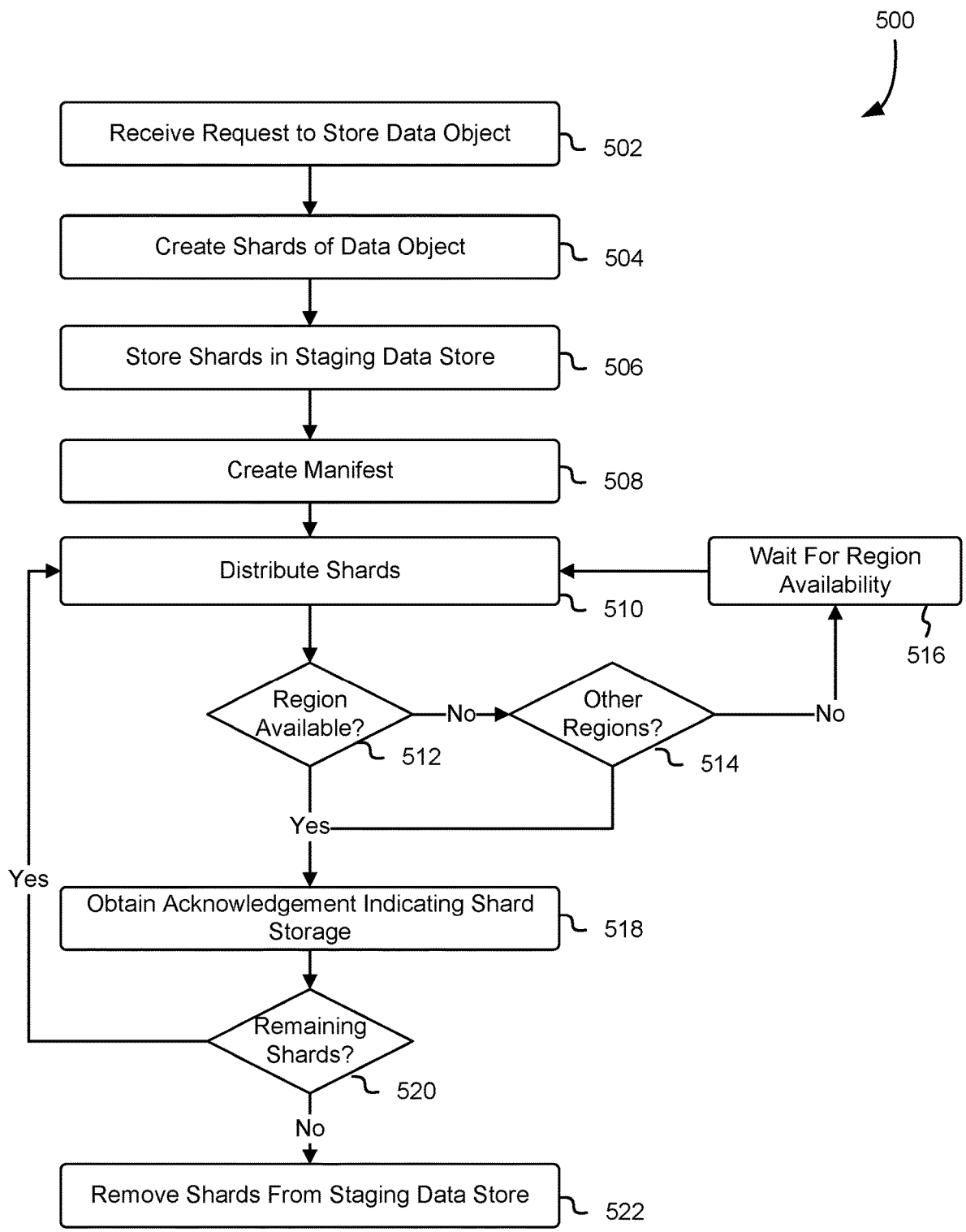
FIG. 5 illustrates a process for storing a data object using hierarchical erasure coding across regions in accordance with various embodiments.

FIG. 5 is an illustrative example of a process 500 for storing a data object using hierarchical erasure codes across regions according to various embodiments described herein. The process 500 may be performed by a data storage service and/or other components of a computing resource service provider, as described above. In step 502, the data storage service receives a request to store a data object. The request may be an API request submitted via a console or other interface. In various embodiments, the request is generated by computing resources (e.g., a virtual computer system) provided by the computing resource service provider. The request may include the data object or may point to or otherwise reference a storage location where the data object is maintained.

In step 504, the data storage service or other system executing the process 500, creates a set of shards representing the data object by at least applying an erasure encoding or other redundancy encoding to the data object. As described above, the erasure encoding applied to the data object, in various embodiments, includes the multi-region encoding level of the hierarchical erasure encoding scheme. In an example, the number of shards generated is determined based at least in part on the number of regions available for storage of the data object, a level of data redundancy associated with the data object, a cost associated with storing the data object, or other factors.

In step 506, the data storage service or other system executing the process 500, stores the shards in a staging data store. The staging data store may include various data stores as described above, for example, the staging data store 316 of FIG. 3. In step 508, the data storage service or other system executing the process 500, creates a manifest associated with the data object. The manifest, in various embodiments, includes information, instructions, and/or transformation to reconstruct the data object. In addition, the manifest may point to or otherwise reference additional manifests, where the additional manifests include information, instructions, and/or transformation to reconstruct a particular shard of the set of shards generated by at least applying the erasure encoding to the data object as described above in step 504. Furthermore, the manifest may be any manifest as described above including the manifest 200 described in connection with FIG. 2.

In step 510, the data storage service or other system executing the process 500 attempts to distribute members (e.g., shards) of the set of shards of the data object to regions indicated in the manifest. Distribution of the set of shards may occur contemporaneously with the creation of the set of shards or may occur at a point in time later. For example, once the set of shards are stored in the staging data store, the data storage service waits until sufficient resources are available to distribute the set of shards. In various embodiments, the manifest indicates a set of possible regions for storage of individual shards of the set of shards. In one example, the manifest may indicate 5 regions for the storage of 3 shards. As a result, in an embodiment, the data storage service may select particular regions to attempt to distribute the set of shards to first and only once the particular region either fails or succeeds to store the shard proceed to the next possible region for storage.

In step 512, the data storage service or other system executing the process 500 determines whether a region is available. In an embodiment, the data storage service transmits a storage request to the region including a particular shard of the set of shards. The region or computing system within the region may respond with an acknowledgement that the particular shard has been stored. In yet other embodiments, the data storage service obtains information indicating the regions availability prior to transmitting the storage request. For example, the data storage service maintains information indicating an available storage capacity for various regions. Returning to step 512, if the region is available (e.g., returns an acknowledgement that the shard has been successfully stored), the data storage service or other system executing the process 500, may continue to step 518. However, if the region is unavailable (e.g., no response to the storage request is received), the data storage service or other system executing the process 500 may continue to step 514.

In step 514, the data storage service or other system executing the process 500 may determine if other regions indicated in the manifest are available for storage of the shard. As described above, the data storage service may transmit a storage request including the shard to the other region. In various embodiments, the data storage service may, in serial or parallel, attempt to store the shard within other regions indicated in the manifest. For example, if the manifest indicates regions A and B, the data store service may attempt to store a particular shard in a region by at least transmitting a first request to region A and, only after the request is unsuccessful, attempt to transmit the request to region B. Returning to step 514, if the other region is available (e.g., returns an acknowledgement that the shard has been successfully stored), the data storage service or other system executing the process 500 may continue to step 518. However, if the region is unavailable (e.g., no response to the storage request is received), the data storage service or other system executing the process 500 may continue to step 516.

In step 516, the data storage service or other system executing the process 500 wait for region availability prior to attempting to distribute the shards again. In various embodiments, the data storage service may wait a predetermined amount of time or monitor region availably to determine when to re-attempt to distribute the set of shards for storage. Furthermore, in some embodiments, the data storage service may distribute a subset of shards of the set of shards and wait for additional region availability.

Returning to step 518, the data storage service or other system executing the process 500 may obtain acknowledgment that the shard included in the storage request has been stored by the region. In various embodiments, the regions store the shard in a staging data store prior to applying an additional erasure encoding to the shard and distributing a set of shards created by applying the additional erasure encoding for local storage as described below in connection with FIG. 6. In this manner, the region may provide acknowledgement of durability storing the shard prior to completion of one or more storage operations (e.g., encoding).

In step 520, the data storage service or other system executing the process 500 determine if additional shards in the set of shards remaining in the staging data storage still require destaging. If one or more shards of the set of shards have not been successfully stored in a region (which may include the region where the staging data store resides), the data storage service or other system executing the process 500 returns to step 510 and continues to distribute shards of the set of shards for storage. However, if all shards of the set of shards have been provided to a region for storage, the data storage service or other system executing the process 500 may proceed to step 522.

In step 522, the data storage service or other system executing the process 500 may delete or otherwise remove the set of shards from the staging data store. For example, periodic maintenance or other clean-up operations cause the set of shards to be delete as a result of the set of shards having been successfully distributed to various regions. In another example, the data storage service or other system executing the process 500 deletes and/or marks the set of shards for deletion once all the shards of the set of shards have been distributed or otherwise destaged.

Variations of the process 500 may be used in accordance with the present disclosure. For example, steps may be omitted, modified, performed in various orders, performed in parallel, or additional steps may be performed. For example, although the process 500 describes a region-based fault domain, other types of fault domains such as network fault domains, power fault domains, logical fault domains, physical fault domains, or any other fault domain suitable for data redundancy storage as described above may be used in connection with FIG. 5.

Figure 6:
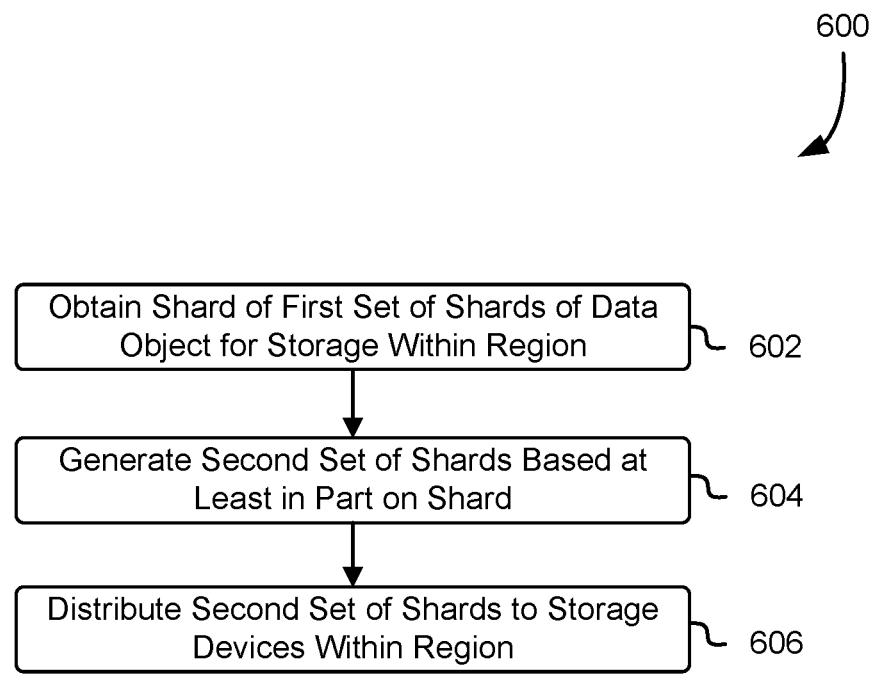
FIG. 6 illustrates a process for storing a data object using erasure encoding within a region in accordance with various embodiments.

FIG. 6 is an illustrative example of a process 600 for storing a shard of a set of shards of a data object using hierarchical erasure codes within a region according to various embodiments described herein. The process 600 may be performed by a data storage service and/or other components of a computing resource service provider, as described above. In step 602, the data storage service or other system executing the process 600 obtains a shard of a first set of shards of the data object for storage within the region. As described above, the first set of shards may be generated by at least applying a first erasure encoding to a data object. The shard, in various embodiments, is obtained in a storage request to store a particular shard of the first set of shards. Furthermore, in some embodiments, the storage request indicates a storage class or other data associated with the data object that indicates a number of shards of the shard to be generated or otherwise determine a level of redundancy to apply to the shard. For example, at the multi-region encoding level 6 shards are generated and, as a result, fewer shards are required at the in-region encoding stage to achieve a particular level of redundancy. In various embodiments, the storage class indicates attributes of the stored data such as a level of redundancy of the data, archival status, storage duration (e.g., how long the data is to be retained), or other attributes of the data.

In step 604, the data storage service or other system executing the process 600 generate a second set of shards of the shard of the first set of shards of the data object. Generating the second set of shards may be performed, as described above, by at least applying an erasure encoding to the shard. In various embodiments, the second set of shards is stored within a staging data store prior to distribution to in-region storage devices. In step 606, shards of the second set of shards are distributed to storage devices within the region. Variations of the process 600 may be used in accordance with the present disclosure. For example, steps may be omitted, modified, performed in various orders, performed in parallel, or additional step may be performed. In addition, within the storage device in the region, additional erasure encodings may be applied to the shards. Although the examples described in the present disclosure generally describe a multi-region encoding stage and an in-region encoding stage, the hierarchical erasure encoding scheme described in the present disclosure may have any number of additional stages and/or encodings.

Figure 7:
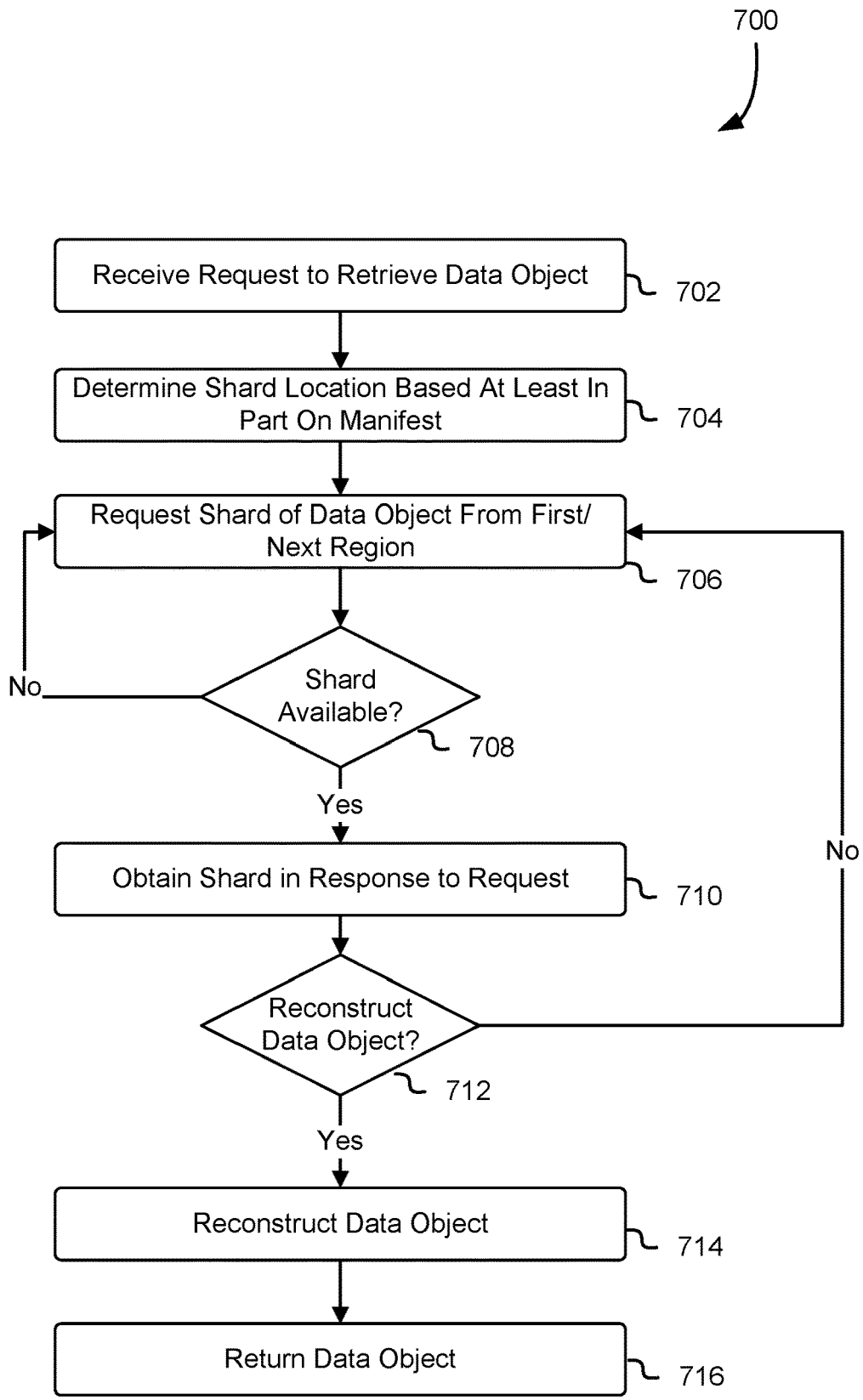
FIG. 7 illustrates a process for obtaining a hierarchical erasure encoded data object from various regions in accordance with various embodiments.

FIG. 7 is an illustrative example of a process 700 for reconstructing a data object from a set of shards of the data object generated using hierarchical erasure codes according to various embodiments described herein. The process 700 may be performed by a data storage service and/or other components of a computing resource service provider, as described above. In step 702, the data storage device obtains a request to retrieve the data object. In various embodiments, the request is obtained from a computing entity as describe above in connection with FIG. 4. In step 704, the data storage service or other system executing the process 700, in response to the request, determines a set of shard locations based at least in part on the manifest. As described above, the manifest may indicate, reference, or otherwise point to additional manifests generated during the in-region encoding stage. For example, a first manifest indicates a set of regions as possible storage locations for shards of the set of shards of the data object, within a particular region that stores a shard, a second manifest points to physical storage locations within the region where shards of a second set of shards generated based at least in part on where the shard is stored.

In step 706, the data storage service or other system executing the process 700 requests a shard of the set of shards of the data object from a first/next region. For example, the manifest indicates regions A, B, C, and D as possible storage locations for 3 shards of the set of shards of the data object. The data storage service may transmit requests to regions A, B, C, and D in serial and wait for a response for the region prior to transmitting a request to the next region. In step 708, the data storage service or other system executing the process 700, determines if a shard of the set of shards is available in the requested region. In on example, the region may return a response indicating that no shards of the set of shards are maintained within the region. In another example, the region may simply not return a response. If, in step 708, the shards are available, the data storage service or other system executing the process 700 continues to step 710. However, if the shard is unavailable, the data storage service or other system executing the process 700 returns to step 706 and requests the shard from a different region. In various embodiments, obtaining the shard requires the region to reconstruct the shard from a second set of shards as described above.

In step 710, the data storage service or other system executing the process 700 obtains the shard in response to the request. In various embodiments, the shard may be stored in a staging data store until there are sufficient shards to reconstruct the data object. In step 712, the data storage service or other system executing the process 700 determines if there are sufficient shards of the set of shards to reconstruct the data object. For example, as a result of the erasure encoding applied to the data object, only a subset of shards of the set of shards may be required to reconstruct the data object. If there are insufficient shards of the set of shards to reconstruct the data object, the data storage service or other system executing the process 700 returns to step 706 and continues to request shards from various regions. However, if there are sufficient shards to reconstruct the data object, the data storage service or other system executing the process 700 continues to step 714.

In step 714, the data storage service or other system executing the process 700 reconstructs the data object based at least in part on a subset of the set of shards obtained from the regions. Reconstruction of the data object, as described above, may be performed by executing the instruction included in the manifest or otherwise reversing the transformation performed to generate the set of shards. In step 716, the data storage service or other system executing the process 700 then transmits the data object in response to the request. Variations of the process 700 may be used in accordance with the present disclosure. For example, steps may be omitted, modified, performed in various orders, performed in parallel, or additional steps may be performed. For example, if the data storage service is unable to obtain sufficient shards to reconstruct the data object, the data storage service causes one or more regions to reconstruct a shard. In another example, the data storage service or other system executing the process 700 may transmit a plurality of requests to various regions in parallel to obtain the subset of shards.

As one skilled in the art will appreciate in light of this disclosure, certain embodiments may be capable of achieving certain advantages, including some or all of the following: reducing a stretch factor for storing data, providing improved redundancy and retention of data object, reducing load on inter-region networking links, increasing the number of fault domains available for data storage, reducing an amount of physical space required to redundantly store data, improving data integrity, reducing networking cost to reconstruct lost data, reducing the impact of failures including disk failures, and providing flexibility in storing data across fault domains.

Figure 8:
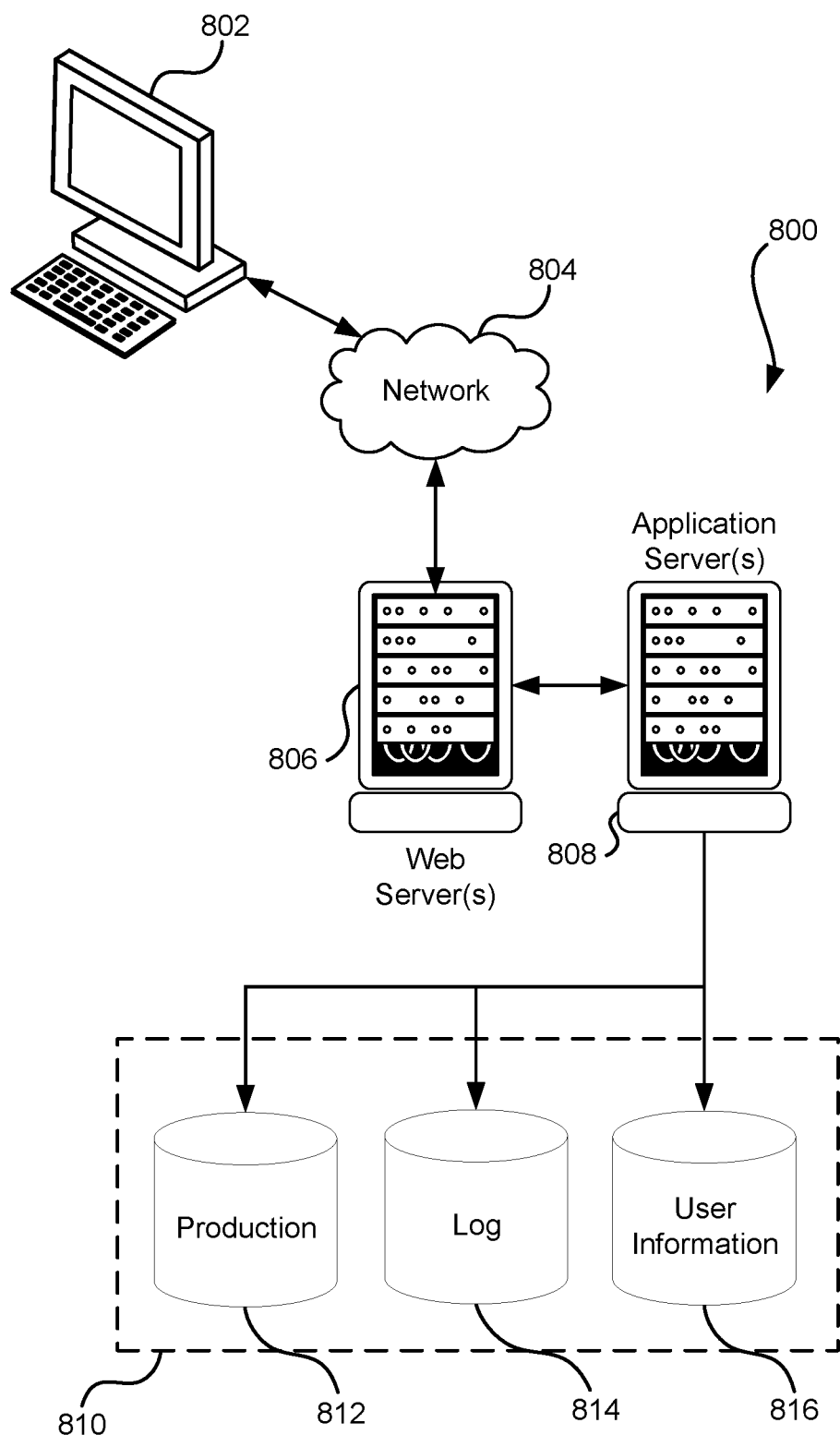
FIG. 8 illustrates a system in which various embodiments can be implemented.

FIG. 8 illustrates aspects of an example system 800 for implementing aspects in accordance with an embodiment. As will be appreciated, although a web-based system is used for purposes of explanation, different systems may be used, as appropriate, to implement various embodiments. In an embodiment, the system includes an electronic client device 802, which includes any appropriate device operable to send and/or receive requests, messages, or information over an appropriate network 804 and convey information back to a user of the device. Examples of such client devices include personal computers, cellular or other mobile phones, handheld messaging devices, laptop computers, tablet computers, set-top boxes, personal data assistants, embedded computer systems, electronic book readers, and the like. In an embodiment, the network includes any appropriate network, including an intranet, the Internet, a cellular network, a local area network, a satellite network or any other such network and/or combination thereof, and components used for such a system depend at least in part upon the type of network and/or system selected. Many protocols and components for communicating via such a network are well known and will not be discussed herein in detail. In an embodiment, communication over the network is enabled by wired and/or wireless connections and combinations thereof. In an embodiment, the network includes the Internet and/or other publicly addressable communications network, as the system includes a web server 806 for receiving requests and serving content in response thereto, although for other networks an alternative device serving a similar purpose could be used as would be apparent to one of ordinary skill in the art.

In an embodiment, the illustrative system includes at least one application server 808 and a data store 810, and it should be understood that there can be several application servers, layers or other elements, processes or components, which may be chained or otherwise configured, which can interact to perform tasks such as obtaining data from an appropriate data store. Servers, in an embodiment, are implemented as hardware devices, virtual computer systems, programming modules being executed on a computer system, and/or other devices configured with hardware and/or software to receive and respond to communications (e.g., web service application programming interface (API) requests) over a network. As used herein, unless otherwise stated or clear from context, the term "data store" refers to any device or combination of devices capable of storing, accessing and retrieving data, which may include any combination and number of data servers, databases, data storage devices and data storage media, in any standard, distributed, virtual or clustered system. Data stores, in an embodiment, communicate with block-level and/or object-level interfaces. The application server can include any appropriate hardware, software and firmware for integrating with the data store as needed to execute aspects of one or more applications for the client device, handling some or all of the data access and business logic for an application.

In an embodiment, the application server provides access control services in cooperation with the data store and generates content including but not limited to text, graphics, audio, video and/or other content that is provided to a user associated with the client device by the web server in the form of HyperText Markup Language ("HTML"), Extensible Markup Language ("XML"), JavaScript, Cascading Style Sheets ("CSS"), JavaScript Object Notation (JSON), and/or another appropriate client-side or other structured language. Content transferred to a client device, in an embodiment, is processed by the client device to provide the content in one or more forms including but not limited to forms that are perceptible to the user audibly, visually and/or through other senses. The handling of all requests and responses, as well as the delivery of content between the client device 802 and the application server 808, in an embodiment, is handled by the web server using PHP: Hypertext Preprocessor ("PHP"), Python, Ruby, Perl, Java, HTML, XML, JSON, and/or another appropriate server-side structured language in this example. In an embodiment, operations described herein as being performed by a single device are performed collectively by multiple devices that form a distributed and/or virtual system.

The data store 810, in an embodiment, includes several separate data tables, databases, data documents, dynamic data storage schemes and/or other data storage mechanisms and media for storing data relating to a particular aspect of the present disclosure. In an embodiment, the data store illustrated includes mechanisms for storing production data 812 and user information 816, which are used to serve content for the production side. The data store also is shown to include a mechanism for storing log data 814, which is used, in an embodiment, for reporting, computing resource management, analysis or other such purposes. In an embodiment, other aspects such as page image information and access rights information (e.g., access control policies or other encodings of permissions) are stored in the data store in any of the above listed mechanisms as appropriate or in additional mechanisms in the data store 810.

The data store 810, in an embodiment, is operable, through logic associated therewith, to receive instructions from the application server 808 and obtain, update or otherwise process data in response thereto, and the application server 808 provides static, dynamic, or a combination of static and dynamic data in response to the received instructions. In an embodiment, dynamic data, such as data used in web logs (blogs), shopping applications, news services, and other such applications, are generated by server-side structured languages as described herein or are provided by a content management system ("CMS") operating on or under the control of the application server. In an embodiment, a user, through a device operated by the user, submits a search request for a certain type of item. In this example, the data store accesses the user information to verify the identity of the user, accesses the catalog detail information to obtain information about items of that type, and returns the information to the user, such as in a results listing on a web page that the user views via a browser on the user device 802. Continuing with this example, information for a particular item of interest is viewed in a dedicated page or window of the browser. It should be noted, however, that embodiments of the present disclosure are not necessarily limited to the context of web pages, but are more generally applicable to processing requests in general, where the requests are not necessarily requests for content. Example requests include requests to manage and/or interact with computing resources hosted by the system 800 and/or another system, such as for launching, terminating, deleting, modifying, reading, and/or otherwise accessing such computing resources.

In an embodiment, each server typically includes an operating system that provides executable program instructions for the general administration and operation of that server and includes a computer-readable storage medium (e.g., a hard disk, random access memory, read only memory, etc.) storing instructions that, if executed by a processor of the server, cause or otherwise allow the server to perform its intended functions (e.g., the functions are performed as a result of one or more processors of the server executing instructions stored on a computer-readable storage medium).

The system 800, in an embodiment, is a distributed and/or virtual computing system utilizing several computer systems and components that are interconnected via communication links (e.g., transmission control protocol (TCP) connections and/or transport layer security (TLS) or other cryptographically protected communication sessions), using one or more computer networks or direct connections. However, it will be appreciated by those of ordinary skill in the art that such a system could operate in a system having fewer or a greater number of components than are illustrated in FIG. 8. Thus, the depiction of the system 800 in FIG. 8 should be taken as being illustrative in nature and not limiting to the scope of the disclosure.

The various embodiments further can be implemented in a wide variety of operating environments, which in some cases can include one or more user computers, computing devices or processing devices that can be used to operate any of a number of applications. In an embodiment, user or client devices include any of a number of computers, such as desktop, laptop or tablet computers running a standard operating system, as well as cellular (mobile), wireless and handheld devices running mobile software and capable of supporting a number of networking and messaging protocols, and such a system also includes a number of workstations running any of a variety of commercially available operating systems and other known applications for purposes such as development and database management. In an embodiment, these devices also include other electronic devices, such as dummy terminals, thin-clients, gaming systems and other devices capable of communicating via a network, and virtual devices such as virtual machines, hypervisors, and software containers utilizing operating-system level virtualization and other virtual devices or non-virtual devices supporting virtualization capable of communicating via a network.

In an embodiment, a system utilizes at least one network that would be familiar to those skilled in the art for supporting communications using any of a variety of commercially available protocols, such as Transmission Control Protocol/Internet Protocol ("TCP/IP"), User Datagram Protocol ("UDP"), protocols operating in various layers of the Open System Interconnection ("OSI") model, File Transfer Protocol ("FTP"), Universal Plug and Play ("UpnP"), Network File System ("NFS"), Common Internet File System ("CIFS") and other protocols. The network, in an embodiment, is a local area network, a wide-area network, a virtual private network, the Internet, an intranet, an extranet, a public switched telephone network, an infrared network, a wireless network, a satellite network, and any combination thereof. In an embodiment, a connection-oriented protocol is used to communicate between network endpoints such that the connection-oriented protocol (sometimes called a connection-based protocol) is capable of transmitting data in an ordered stream. In an embodiment, a connection-oriented protocol can be reliable or unreliable. For example, the TCP protocol is a reliable connection-oriented protocol. Asynchronous Transfer Mode ("ATM") and Frame Relay are unreliable connection-oriented protocols. Connection-oriented protocols are in contrast to packet-oriented protocols such as UDP that transmit packets without a guaranteed ordering.

In an embodiment, the system utilizes a web server that runs one or more of a variety of server or mid-tier applications, including Hypertext Transfer Protocol ("HTTP") servers, FTP servers, Common Gateway Interface ("CGI") servers, data servers, Java servers, Apache servers, and business application servers. In an embodiment, the one or more servers are also capable of executing programs or scripts in response to requests from user devices, such as by executing one or more web applications that are implemented as one or more scripts or programs written in any programming language, such as Java®, C, C# or C++, or any scripting language, such as Ruby, PHP, Perl, Python or TCL, as well as combinations thereof. In an embodiment, the one or more servers also include database servers, including without limitation those commercially available from Oracle®, Microsoft®, Sybase®, and IBM® as well as open-source servers such as MySQL, Postgres, SQLite, MongoDB, and any other server capable of storing, retrieving, and accessing structured or unstructured data. In an embodiment, a database server includes table-based servers, document-based servers, unstructured servers, relational servers, non-relational servers, or combinations of these and/or other database servers.

In an embodiment, the system includes a variety of data stores and other memory and storage media as discussed above that can reside in a variety of locations, such as on a storage medium local to (and/or resident in) one or more of the computers or remote from any or all of the computers across the network. In an embodiment, the information resides in a storage-area network ("SAN") familiar to those skilled in the art and, similarly, any necessary files for performing the functions attributed to the computers, servers or other network devices are stored locally and/or remotely, as appropriate. In an embodiment where a system includes computerized devices, each such device can include hardware elements that are electrically coupled via a bus, the elements including, for example, at least one central processing unit ("CPU" or "processor"), at least one input device (e.g., a mouse, keyboard, controller, touch screen, or keypad), at least one output device (e.g., a display device, printer, or speaker), at least one storage device such as disk drives, optical storage devices, and solid-state storage devices such as random access memory ("RAM") or read-only memory ("ROM"), as well as removable media devices, memory cards, flash cards, etc., and various combinations thereof.

In an embodiment, such a device also includes a computer-readable storage media reader, a communications device (e.g., a modem, a network card (wireless or wired), an infrared communication device, etc.), and working memory as described above where the computer-readable storage media reader is connected with, or configured to receive, a computer-readable storage medium, representing remote, local, fixed, and/or removable storage devices as well as storage media for temporarily and/or more permanently containing, storing, transmitting, and retrieving computer-readable information. In an embodiment, the system and various devices also typically include a number of software applications, modules, services, or other elements located within at least one working memory device, including an operating system and application programs, such as a client application or web browser. In an embodiment, customized hardware is used and/or particular elements are implemented in hardware, software (including portable software, such as applets), or both. In an embodiment, connections to other computing devices such as network input/output devices are employed.

In an embodiment, storage media and computer readable media for containing code, or portions of code, include any appropriate media known or used in the art, including storage media and communication media, such as but not limited to volatile and non-volatile, removable and non-removable media implemented in any method or technology for storage and/or transmission of information such as computer readable instructions, data structures, program modules or other data, including RAM, ROM, Electrically Erasable Programmable Read-Only Memory ("EEPROM"), flash memory or other memory technology, Compact Disc Read-Only Memory ("CD-ROM"), digital versatile disk (DVD) or other optical storage, magnetic cassettes, magnetic tape, magnetic disk storage or other magnetic storage devices or any other medium which can be used to store the desired information and which can be accessed by the system device. Based on the disclosure and teachings provided herein, a person of ordinary skill in the art will appreciate other ways and/or methods to implement the various embodiments.

In various embodiments described throughout this disclosure, computing resources are configured to perform tasks (e.g., generate data, process data, store data, route messages, transmit data, submit requests, process requests) by loading computer-readable executable instructions into memory that, as a result of execution by one or more processors, cause the one or more processors to execute instructions to perform tasks. In at least one embodiment, a computer system is configured to perform a task through a software application that controls the execution of specific commands, requests, tasks, jobs, and more. A computer system may be configured to execute computer-readable instructions encoded in a software application by loading executable code of the software application into memory and using one or more processors of the computer system to run the executable instructions.

The specification and drawings are, accordingly, to be regarded in an illustrative rather than a restrictive sense. It will, however, be evident that various modifications and changes may be made thereunto without departing from the broader spirit and scope of the subject matter set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the subject matter recited by the claims to the specific form or forms disclosed but, on the contrary, the intention is to cover all modifications, alternative constructions, and equivalents falling within the spirit and scope of this disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. Similarly, use of the term "or" is to be construed to mean "and/or" unless contradicted explicitly or by context. The terms "comprising," "having," "including," and "containing" are to be construed as open-ended terms (i.e., meaning "including, but not limited to,") unless otherwise noted. The term "connected," when unmodified and referring to physical connections, is to be construed as partly or wholly contained within, attached to, or joined together, even if there is something intervening. Recitation of ranges of values herein are merely intended to serve as a shorthand method of referring individually to each separate value falling within the range, unless otherwise indicated herein, and each separate value is incorporated into the specification as if it were individually recited herein. The use of the term "set" (e.g., "a set of items") or "subset" unless otherwise noted or contradicted by context, is to be construed as a nonempty collection comprising one or more members. Further, unless otherwise noted or contradicted by context, the term "subset" of a corresponding set does not necessarily denote a proper subset of the corresponding set, but the subset and the corresponding set may be equal. The use of the phrase "based on," unless otherwise explicitly stated or clear from context, means "based at least in part on" and is not limited to "based solely on."

Conjunctive language, such as phrases of the form "at least one of A, B, and C," or "at least one of A, B and C," (i.e., the same phrase with or without the Oxford comma) unless specifically stated otherwise or otherwise clearly contradicted by context, is otherwise understood within the context as used in general to present that an item, term, etc., may be either A or B or C, any nonempty subset of the set of A and B and C, or any set not contradicted by context or otherwise excluded that contains at least one A, at least one B, or at least one C. For instance, in the illustrative example of a set having three members, the conjunctive phrases "at least one of A, B, and C" and "at least one of A, B and C"

refer to any of the following sets: {A}, {B}, {C}, {A, B}, {A, C}, {B, C}, {A, B, C}, and, if not contradicted explicitly or by context, any set having {A}, {B}, and/or {C} as a subset (e.g., sets with multiple "A"). Thus, such conjunctive language is not generally intended to imply that certain embodiments require at least one of A, at least one of B and at least one of C each to be present. Similarly, phrases such as "at least one of A, B, or C" and "at least one of A, B or C" refer to the same as "at least one of A, B, and C" and "at least one of A, B and C" refer to any of the following sets: {A}, {B}, {C}, {A, B}, {A, C}, {B, C}, {A, B, C}, unless differing meaning is explicitly stated or clear from context. In addition, unless otherwise noted or contradicted by context, the term "plurality" indicates a state of being plural (e.g., "a plurality of items" indicates multiple items). The number of items in a plurality is at least two but can be more when so indicated either explicitly or by context.

Operations of processes described herein can be performed in any suitable order unless otherwise indicated herein or otherwise clearly contradicted by context. In an embodiment, a process such as those processes described herein (or variations and/or combinations thereof) is performed under the control of one or more computer systems configured with executable instructions and is implemented as code (e.g., executable instructions, one or more computer programs or one or more applications) executing collectively on one or more processors, by hardware or combinations thereof. In an embodiment, the code is stored on a computer-readable storage medium, for example, in the form of a computer program comprising a plurality of instructions executable by one or more processors. In an embodiment, a computer-readable storage medium is a non-transitory computer-readable storage medium that excludes transitory signals (e.g., a propagating transient electric or electromagnetic transmission) but includes non-transitory data storage circuitry (e.g., buffers, cache, and queues) within transceivers of transitory signals. In an embodiment, code (e.g., executable code or source code) is stored on a set of one or more non-transitory computer-readable storage media having stored thereon executable instructions that, when executed (i.e., as a result of being executed) by one or more processors of a computer system, cause the computer system to perform operations described herein. The set of non-transitory computer-readable storage media, in an embodiment, comprises multiple non-transitory computer-readable storage media, and one or more of individual non-transitory storage media of the multiple non-transitory computer-readable storage media lack all of the code while the multiple non-transitory computer-readable storage media collectively store all of the code. In an embodiment, the executable instructions are executed such that different instructions are executed by different processors—for example, in an embodiment, a non-transitory computer-readable storage medium stores instructions and a main CPU executes some of the instructions while a graphics processor unit executes other instructions. In another embodiment, different components of a computer system have separate processors and different processors execute different subsets of the instructions.

Accordingly, in an embodiment, computer systems are configured to implement one or more services that singly or collectively perform operations of processes described herein, and such computer systems are configured with applicable hardware and/or software that enable the performance of the operations. Further, a computer system, in an embodiment of the present disclosure, is a single device and, in another embodiment, is a distributed computer system comprising multiple devices that operate differently such that the distributed computer system performs the operations described herein and such that a single device does not perform all operations.

The use of any and all examples or exemplary language (e.g., "such as") provided herein is intended merely to better illuminate various embodiments and does not pose a limitation on the scope of the claims unless otherwise claimed. No language in the specification should be construed as indicating any non-claimed element as essential to the practice of inventive subject material disclosed herein.

Embodiments of this disclosure are described herein, including the best mode known to the inventors for carrying out inventive concepts described herein. Variations of those embodiments may become apparent to those of ordinary skill in the art upon reading the foregoing description. The inventors expect skilled artisans to employ such variations as appropriate, and the inventors intend for embodiments of the present disclosure to be practiced otherwise than as specifically described herein. Accordingly, the scope of the present disclosure includes all modifications and equivalents of the subject matter recited in the claims appended hereto as permitted by applicable law. Moreover, any combination of the above-described elements in all possible variations thereof is encompassed by the scope of the present disclosure unless otherwise indicated herein or otherwise clearly contradicted by context.

All references including publications, patent applications, and patents cited herein are hereby incorporated by reference to the same extent as if each reference were individually and specifically indicated to be incorporated by reference and were set forth in its entirety herein.

What is claimed is:

1. A computer-implemented method, comprising:
    obtaining a storage request including a data object for storage with a data storage service;
    generating a first set of shards of the data object based at least in part on a first encoding scheme;
    determining a first region of a set of regions for storage of a first shard of the first set of shards of the data object based at least in part on a manifest associated with the data object, the manifest including a set of transformations to reconstruct the data object from a first subset of shards of the first set of shards of the data object and information indicating the set of regions to store shards of the first set of shards;
    transmitting the first shard of the first set of shards of the data object to the first region for storage; and
    causing the first region to generate a second set of shards of the first shard of the first set of shards of the data object based at least in part on a second encoding scheme, wherein the second set of shards are distributed within the first region.

2. The computer-implemented method of claim 1, wherein the computer-implemented method further comprises storing the first set of shards in a staging storage device within a second region that is not a member of the set of regions.

3. The computer-implemented method of claim 2, further comprising:
    obtaining a request to retrieve the data object;
    obtaining the manifest associated with the data object;
    determining, based at least in part on the manifest, a subset of regions of the set of regions to request shards of the first set of shards from;
    transmitting a request to a third region of the subset of regions for a second shard of the first set of shards;

receiving the second shard of the first set of shards; and
reconstructing the data object using a second subset of shards of the first set of shards of the data object where the second subset of shards includes at least the second shard of the first set of shards.

4. The computer-implemented method of claim 1, wherein the storage request comprises a storage class associated with the data object, where the storage class indicates a number of shards of the data object to generate.

5. A system, comprising:
one or more processors; and
memory that stores computer-executable instructions that, as a result of being executed by the one or more processors, cause the system to:
generate a first set of shards of a data object by at least applying a first erasure encoding to the data object;
obtain a manifest associated with the first set of shards, the manifest including instructions to generate the data object from a first subset of shards of the first set of shards and location information for the first set of shards;
determine a first region for storage of a first shard of the first set of shards; and
provide the first shard to the first region, where the first region generates a second set of shards by at least applying a second erasure encoding to the first shard, wherein the second set of shards are distributed within the first region.

6. The system of claim 5, wherein the memory stores further instructions that, as a result of being executed by the one or more processors, cause the system to:
generate a determination of a capacity within the first region is above a threshold; and
based at least in part on the determination, cause the first region to move the first shard to a second region.

7. The system of claim 5, wherein the manifest comprises information indicating a first physical representation of the data object at a first point in time and a second physical representation of the data object at a second point in time, where the location information for the first set of shards indicates the second physical representation of the data object at the second point in time.

8. The system of claim 5, wherein the memory stores further instructions that, as a result of being executed by the one or more processors, cause the system to:
obtain a request for the data object;
request the first shard from a first region based at least in part on location information for the first set of shards;
reconstruct the data object from the first subset of shards; and
provide the data object in response to the request.

9. The system of claim 5, wherein the memory stores further instructions that, as a result of being executed by the one or more processors, cause the system to:
generate a determination that the first shard is unavailable; and
reconstruct the data object by at least obtaining a second subset of shards of the first set of shards from a set of regions not including the first region.

10. The system of claim 5, wherein the instructions that cause the system to determine the first region for storage of the first shard further comprises instructions that, as a result of being executed by the one or more processors, cause the system to determine the first region based at least in part on an availability of the first region during destaging of the first set of shards.

11. The system of claim 5, wherein the second erasure encoding generates fewer shards than the first erasure encoding.

12. The system of claim 5, wherein the first erasure encoding and the second erasure encoding are the same encoding scheme.

13. A non-transitory computer-readable storage medium storing thereon executable instructions that, as a result of being executed by one or more processors of a first computer system, cause the first computer system to:
encode a first set of shards of a data object;
obtain a manifest that includes a set of instructions to perform operations to convert at least a subset of shards of the first set of shards to the data object; and
cause a second computer system within a first fault domain to encode a second set of shards based at least in part on a first shard of the first set of shards such that the first shard can be reconstructed from the second set of shards, wherein the second set of shards are distributed within the first fault domain.

14. The non-transitory computer-readable storage medium of claim 13, wherein the instructions, as a result of being executed by the one or more processors, cause the first computer system to receive a request to store the data object, the request including information indicating a hierarchical erasure encoding utilized to store the data object.

15. The non-transitory computer-readable storage medium of claim 13, wherein the instructions, as a result of being executed by the one or more processors, cause the first computer system to store the first set of shards in a staging data store.

16. The non-transitory computer-readable storage medium of claim 13, wherein the first computer system is within a second fault domain and the first fault domain and the second fault domain are distinct fault domains.

17. The non-transitory computer-readable storage medium of claim 16, wherein the first fault domain and the second fault domain are networking fault domains.

18. The non-transitory computer-readable storage medium of claim 13, wherein the instructions, as a result of being executed by the one or more processors, cause the first computer system to:
obtain the subset of shards of the first set of shards from a set of computer systems including the second computer system by at least transmitting a request to the second computer system for the first shard; and
reconstruct the data object from the subset of shards based at least in part on the manifest.

19. The non-transitory computer-readable storage medium of claim 13, wherein the manifest further includes information indicating the second computer system as a location of the first shard.

20. The non-transitory computer-readable storage medium of claim 13, wherein the first set of shards and the second set of shards are encoded using different erasure encoding schemes.

\* \* \* \* \*